(12) United States Patent
Barre et al.

(10) Patent No.: US 9,735,533 B2
(45) Date of Patent: Aug. 15, 2017

(54) ULTRASHOT PULSE FIBER LASER

(71) Applicant: Deutsches Elektronen-Synchrotron DESY, Hamburg (DE)

(72) Inventors: Damian Barre, Hamburg (DE); Franz Kärtner, Hamburg (DE)

(73) Assignee: Deutsches Elektronen-Synchrotron DESY, Hamburg (DE)

( * ) Notice: Subject to any disclaimer, the term of this patent is extended or adjusted under 35 U.S.C. 154(b) by 0 days.

(21) Appl. No.: 14/993,602

(22) Filed: Jan. 12, 2016

(65) Prior Publication Data

US 2016/0204565 A1 Jul. 14, 2016

(30) Foreign Application Priority Data

Jan. 13, 2015 (DE) .................... 10 2015 200 366

(51) Int. Cl.
*H01S 3/083* (2006.01)
*H01S 3/067* (2006.01)
(Continued)

(52) U.S. Cl.
CPC .......... *H01S 3/06791* (2013.01); *H01S 3/083* (2013.01); *H01S 3/0823* (2013.01); *H01S 3/108* (2013.01); *H01S 3/10061* (2013.01); *H01S 3/1062* (2013.01); *H01S 3/1112* (2013.01); *H01S 5/1071* (2013.01);
(Continued)

(58) Field of Classification Search
CPC ............... H01S 3/06791; H01S 5/1071; H01S 3/10061; H01S 3/083; H01S 3/108; H01S 3/1062; H01S 3/1112; H01S 3/0823; H01S 5/1212; H01S 3/06712; H01S 3/0675; H01S 2301/08
See application file for complete search history.

(56) References Cited

U.S. PATENT DOCUMENTS 5,828,680 A * 10/1998 Kim .................... H01S 3/06791
372/18
2006/0171426 A1   8/2006 Starodoumov et al.
(Continued)

OTHER PUBLICATIONS

Buckley et al., Femtosecond Fiber Lasers With Pulse Energies Above 10 nJ, Optics Letters vol. 30, No. 14, Jul. 15, 2005, pp. 1888-1890.
(Continued)

*Primary Examiner* — Yuanda Zhang
(74) *Attorney, Agent, or Firm* — Murtha Cullina LLP

(57) ABSTRACT

The invention is a passively mode-locked ultrashort pulse fiber laser for generating ultrashort laser pulses, including a resonator in a figure-of-eight configuration, wherein the resonator has a main ring and a secondary ring optically coupled thereto designed as a non-linear Sagnac interferometer, and wherein the main ring and the secondary ring are constructed of polarization-maintaining optical fibers, and the main ring and/or secondary ring have a fiber section designed as a laser-active medium, wherein the laser-active medium is optically pumped through an externally-coupled pump light source which is also comprised, wherein the ultrashort pulse fiber laser is developed in that a separate optical unit is provided in the resonator as a dispersion compensation unit for compensating a group delay dispersion of the ultrashort laser pulses.

13 Claims, 7 Drawing Sheets

(51) Int. Cl.
    *H01S 3/106*     (2006.01)
    *H01S 3/108*     (2006.01)
    *H01S 3/10*     (2006.01)
    *H01S 5/10*     (2006.01)
    *H01S 3/082*     (2006.01)
    *H01S 3/11*     (2006.01)
    *H01S 5/12*     (2006.01)

(52) U.S. Cl.
    CPC ......... *H01S 3/0675* (2013.01); *H01S 3/06712* (2013.01); *H01S 5/1212* (2013.01); *H01S 2301/08* (2013.01)

(56) References Cited

U.S. PATENT DOCUMENTS

| | | |
|---|---|---|
| 2008/0025348 A1 | 1/2008 | Kuksenkov et al. |
| 2008/0144676 A1 | 6/2008 | Nicholson |
| 2009/0003391 A1 | 1/2009 | Li |
| 2010/0061407 A1 | 3/2010 | Nicholson |
| 2012/0033690 A1* | 2/2012 | Renninger ............ H01S 3/067 372/25 |
| 2015/0071322 A1* | 3/2015 | Haensel ............ H01S 3/06791 372/107 |
| 2016/0268760 A1* | 9/2016 | Sorokina ............... H01S 3/0811 |

OTHER PUBLICATIONS

Noske D U et al.: "Dual-wavelength operation of a passively mode-locked "figure-of-eight" ytterbium-erbium fibre soliton laser", Optics Communications, vol. 108, No. 4-6, Jun. 1, 1994, pp. 297-301.

Wei-Wei Hsiang et al: "Passive synchronization between a self-similar pulse and a bound-soliton bunch in a two-color mode-locked fiber laser", Optics Letters, vol. 34, No. 13, Jul. 1, 2009, pp. 1967-1969.

L. Yun. "All-fiber laser simultaneously delivering multi-wavelength solitons", Optics Communications, vol. 322, Jul. 1, 2014, pp. 61-65.

C. Aguergaray, R Hawker, A.F.J. Runge, M. Erkintalo and N.G.R. Broderick, "120 fs, 42 nJ pulses from an all-normal-dispersion, polarization-maintaining, fiber laser," Appl. Phys. Lett. 103, 121111 (2013).

* cited by examiner

ULTRASHORT PULSE FIBER LASER

The invention relates to a passively mode-locked ultrashort pulse fiber laser for generating ultrashort laser pulses, comprising a resonator in a figure-of-eight configuration, wherein the resonator has a main ring and a secondary ring optically coupled thereto designed as a non-linear Sagnac interferometer, and wherein the main ring and the secondary ring are constructed of polarization-maintaining optical fibers, and the main ring and/or secondary ring have a fiber section designed as a laser-active medium, wherein the laser-active medium is optically pumped through an externally-coupled pump light source which is also comprised.

BACKGROUND

Ultrashort laser pulses have many uses which range from information technology to material processing. To generate ultrashort laser pulses, fiber lasers, for example, are used in which the laser light is guided in an optical fiber in the resonator. A correspondingly doped optical fiber or a doped fiber section serves as a laser amplifier medium. Depending on the laser wavelength, different doping elements are possible, especially rare earths.

Mode-locked ultrashort pulse fiber lasers are known which are constructed in a figure-of-eight configuration. Such a laser is known for example from US 2008/0144676 A1. Mode-locking is active or passive. In the event of active mode-locking, and electro-optical or acousto-optical modulator is arranged in the resonator.

For mode-locked ultrashort pulse fiber lasers, fibers or fiber sections with normal and abnormal dispersion are frequently combined. In the context of the present description, "dispersion" stands for group delay dispersion, i.e., pulse propagation per spectral bandwidth (in an angular frequency). In the event of normal dispersion in a fiber with a fixed length, the group speed decreases with the frequency. In the event of abnormal dispersion, the group speed increases with the frequency.

By combining optical fibers with opposing dispersion, it is possible to compensate for dispersion arising in the fibers as the light pulses pass through. Depending on the respective spectral range, optical fiber modules with corresponding dispersion for dispersion compensation with simultaneous monomode operation are difficult to obtain and are correspondingly laborious to create and expensive. Furthermore, it is technically demanding to splice the optical fiber module to a conventional fiber.

US 2008/0144676 A1 proposes a design in which components are used that have normal and abnormal dispersion. In order to start the ultrashort pulse fiber laser, a modulator is integrated in one of the two rings of the figure-of-eight configuration. This is coupled to an external signal source which is operated at the frequency of the laser.

A design for an ultrashort pulse fiber laser is found in C. Aguergaray, R. Hawker, A. F. J. Runge, M. Erkintalo, and N. G. R. Broderick: "120 fs, 4.2 nJ pulses from an all-normal-dispersion, polarization-maintaining, fiber laser", Appl. Phys. Lett. 103, 121111 (2013) with an optical bandpass filter integrated in its figure-of-eight configuration. This serves to generate self-consistent pulse propagation and support passive mode-locking. A modulator does not have to be used in this context since the laser is self-starting. A laser configuration consisting entirely of normally dispersive components and a bandpass filter is also termed a so-called ANDI design (all normal dispersion).

Another fiber laser is known from US 2008/0025348 A1. This comprises a main ring and a reinforcing ring which are constructed from fibers with different dispersion. The reinforcing ring is constructed from fibers with a positive dispersion, and the main ring is constructed, at least in sections, from fibers with a negative dispersion. To achieve complete dispersion compensation, a dispersion compensator constructed from fibers is also integrated in the main ring. This comprises two chirped fiber Bragg gratings with which differential dispersion compensation is achieved.

SUMMARY

On the basis of this prior art, the object of the invention is to provide a passively mode-locked ultrashort pulse fiber laser that is stable against external influences.

This object is achieved with a passively mode-locked ultrashort pulse fiber laser for generating ultrashort laser pulses, comprising a resonator in a figure-of-eight configuration, wherein the resonator has a main ring and a secondary ring optically coupled thereto designed as a non-linear Sagnac interferometer, and wherein the main ring and the secondary ring are constructed of polarization-maintaining optical fibers, and the main ring and/or secondary ring have a fiber section designed as a laser-active medium, wherein the laser-active medium is optically pumped through an externally-coupled pump light source which is also comprised, wherein the ultra-short pulse fiber laser is developed in that there is a dispersion compensation unit in the resonator for compensating a group delay dispersion of the ultrashort laser pulses, wherein the dispersion compensation unit is a separate optical unit, and wherein the dispersion compensation unit comprises at least one dispersion compensation element, and a free beam path at one input and/or an output of the dispersion compensation unit is between a first end and/or a second end of the optical fiber of the main ring and/or the secondary ring and the dispersion compensation element, such that the dispersion compensation element forms an optical unit separate from the optical fiber, in particular spatially and optically isolated, and wherein a polarization adaptation element is provided at an output of the dispersion compensation unit, wherein the polarization adaptation element is set up to adapt a polarization state of a laser pulse leaving the dispersion compensation unit to a polarization direction of the optical fiber.

The main ring and the secondary ring are fiber-based rings. In other words, the light pulses propagated in the rings are guided within optical fibers within the great majority of the path. An optical isolator or an optical circulator is provided in the main ring which establishes the direction of propagation, i.e., the direction of pulse propagation, in the main ring.

The ultrashort pulse fiber laser according to the invention has the following advantages, inter alia: Due to the self-starting passive mode-locking from a combination of the main ring and secondary ring, active mode-locking including the often complex associated control electronics and modulators are unnecessary. Due to the use of polarization-maintaining optical fibers, the design is stable against environmental influences such as temperature fluctuations or vibrations. Excellent pulse quality is achieved which is manifested by short pulse durations and the suppression of interfering pulse background. Furthermore, the spectrum has a good shape; Above all, the occurrence of undesirable sidebands in the spectral spectrum is minimized or even completely prevented. The employed components of the laser are largely free of adjustment. The saturable absorbers which are frequently necessary in passively mode-locked ultrashort pulse fiber lasers and are arranged in known systems in the resonator, are also advantageously discarded.

The cited advantages are achieved in that an dispersion compensation unit is arranged in the resonator of the ultrashort pulsed fiber laser dispersion compensation unit is a separate optical unit, and wherein the dispersion compensation unit comprises at least one dispersion compensation element, and a free beam path is between a first end and/or a second end of the optical fiber of the main ring and/or the secondary ring and the dispersion compensation element at one input and/or an output of the dispersion compensation unit, such that the dispersion compensation element forms an optical unit separate from the optical fiber, in particular spatially and optically isolated.

With the ultrashort pulse fiber laser according to the aspects of the invention, pulse durations of less than 100 fs can be achieved with repetition rates of more than 100 kHz, in particular with repetition rates of approximately 20 MHz. Such a repetition rate is for example advantageous in industrial uses such as laser drilling or laser cutting, as well as in uses in medical technology such as two photon spectroscopy.

In passively mode-locked ultrashort pulse fiber lasers according to the invention, exclusively polarization-maintaining optical fibers are used. In particular, exclusively monomode and base-mode optical fiber modules are used.

If the ultrashort pulse fiber laser is operated at an average wavelength of approximately 1 µm, exclusively light fibers with a normal dispersion are preferably used.

Furthermore, the laser-active medium is preferably doped with one of the following elements: Ytterbium (Yb), erbium (Er), thulium (Tm), holmium (Ho), neodymium (Nd), and praseodymium (Pr). Which of the cited elements is used as dopant for the laser-active medium depends on the respective purpose and the desired average laser wavelength.

According to other exemplary embodiments in which the laser-active medium is doped with at least one of the elements erbium (Er), thulium (Tm) or holmium (Ho), the laser wavelength lies within a spectral range in which the optical fibers preferably have an abnormal dispersion; consequently, an abnormal dispersion is preferably used.

According to one advantageous embodiment, the secondary ring comprises a section consisting of a non-linear optical fiber, and the dispersion compensation unit is arranged within the secondary ring. In particular, a fiber section designed as a laser active medium is provided in the secondary ring.

In the context of the present description, a non-linear optical fiber is understood to be a fiber possessing the function of collecting the non-linear phase which is essential for the operation of the non-linear Sagnac interferometer.

The ultrashort pulse fiber laser is furthermore developed in that the main ring and the secondary ring are coupled by means of a coupler, wherein the dispersion compensation unit in the secondary ring is arranged directly adjacent to the coupler. In other words, a laser pulse coupled into the secondary ring first passes through the dispersion compensation unit, and then passes through an optional laser-active medium provided in the secondary ring. Accordingly, the losses of the dispersion compensation unit are compensated by the downstream amplifier; furthermore, laser pulses are consistently provided with a predetermined elevated output intensity independent of the intensity of the incoming laser pulses.

According to another embodiment, the dispersion compensation unit and the section consisting of the non-linear optical fiber are arranged directly adjacent to each other such that a laser pulse propagating in the secondary ring that has passed through the dispersion compensation unit to compensate for its group delay dispersion subsequently directly enters the section consisting of the non-linear optical fiber, wherein the secondary ring does not comprise a laser-active medium.

The non-linear effects occurring in the non-linear fiber section depend on the intensity. A laser pulse whose group delay dispersion was compensated (by the dispersion compensation unit) has a higher pulse peak intensity relative to the uncompensated, and hence also uncompressed, laser pulse. The compressed laser pulse that leaves the dispersion compensation unit therefore generates non-linear effects in the non-linear fiber section comparable to those that an amplified, uncompressed laser pulse would produce. It is therefore possible to dispense with an amplifier, i.e., a laser-active medium, in the secondary ring.

The advantageous embodiment in which the dispersion compensation unit is arranged in the secondary ring directly behind the coupler constitutes an asymmetrical arrangement in the non-linear Sagnac loop. Given such an asymmetrical use of the dispersion component unit directly behind the coupler, the laser pulses which are coupled into the non-linear Sagnac loop, i.e., the secondary ring, need to be chirped or stretched. The dispersion compensation unit primarily compensates for the imprinted chirp. However, this is done before or after non-linear pulse propagation depending on the direction of circulation through the Sagnac loop. The advantage of chiefly compensating for the chirp by means of the dispersion compensation unit is that a higher pulse peak performance exists after passing through the dispersion compensation unit. Increased pulse peak performance allows increased non-linearity, for example in the form of the non-linear effect of the self-phase modulation. The advantage of the asymmetrical arrangement is that the accumulated non-linear phase becomes more different in both circulation directions. This is essential for the functioning of the non-linear Sagnac loop. It is accordingly possible in certain cases to entirely dispense with the use of the fiber amplifier in the non-linear Sagnac loop; in other words, there is no laser-active medium in the secondary ring. This significantly decreases the production cost of the laser.

In this context, it is also possible to provide two dispersion compensation modules, i.e., a first module before the coupler to the secondary ring (non-linear Sagnac loop), and another, actual dispersion compensation module asymmetrically behind one of the outputs of the coupler in the secondary ring. Hence according to another embodiment, a first dispersion compensation unit is connected within the main ring, and a second dispersion compensation unit is connected within the secondary ring.

Furthermore, the ultrashort pulse fiber laser according to aspects of the invention is developed in that the secondary ring is constructed at least in sections from a highly non-linear optical fiber, or comprises a highly non-linear optical fiber section, wherein the fiber non-linearity factor of the highly non-linear optical fiber, or the highly-non-linear optical fiber section, is greater than three, in particular greater than five, more particularly greater than seven, more particularly greater than eight, more particularly greater than ten, and more particularly greater than thirteen, wherein the fiber non-linearity factor in the unit is considered to be $1/(W*km)$.

In other words in the context of the present description, a highly non-linear optical fiber is understood to be an optical fiber with a fiber non-linearity factor greater than three 1/(W*km), in particular greater than one of the other cited values.

By using a highly non-linear optical fiber, it is possible to design the fiber significantly shorter than in previously known lasers. In this context, it is important that similar values of the product consisting of the length of the fiber and its non-linearity factor γ are achieved as are known with conventional lasers despite the shorter length of the optical fiber. Advantageously, the shorter length of the optical fiber however leads to shorter recirculating times of the laser pulses in the resonator. Due to this measure, it is possible to increase the repetition rate of the laser. For example, the repetition rate of 10 MHz can be increased up to the range of 20 MHz or more.

To bring the repetition rate below 1 MHz according to aspects of the invention, an optical circulator and a longer polarization-maintaining or polarizing optical fiber is to be provided in the double pass configuration. In other words, the fiber section designed as a double pass is passed through in both the to and from direction and is hence used optically twice. A significant length of fiber can be spared due to the double pass configuration which means a cost advantage.

According to one embodiment which is realized as a double pass configuration, an optical circulator with a first to third connection is provided in the main ring, wherein the circulator is integrated in the main ring such that laser pulses propagating in the main ring in a direction of propagation are coupled into the circulator at the first connection and are transferred by the circulator to the second connection, wherein a delaying fiber section of the main ring is coupled to the second connection, and a reversing mirror is at its end facing away from the circulator, the reversing mirror being set up to reflect the laser pulses passing through the delaying fiber section back into the delaying fiber section, wherein laser pulses that have passed through the delaying fiber section coming from the reversing mirror are coupled at the second connection into the circulator and are transmitted by the circulator to the third connection so that the laser pulse is propagated in the direction of propagation into the main ring. The delaying fiber section is a part of the resonator and is passed through in the double pass.

In the context of the present description, a reversing mirror is not merely understood to be a mirror designed as a separate optical component, but rather as for example a fiber-based optical element also functioning as a reversing mirror. Accordingly for example, a fiber Bragg grating is provided at the end of the delaying fiber section facing away from the circulator.

According to another advantageous development of the ultrashort pulse fiber laser, the reversing mirror is simultaneously designed as an outcoupling mirror for coupling out the laser pulses propagating in the resonator. Advantageously, the reversing mirror therefore has a dual function so that an optical element can be spared.

Even in the case in which the reversing mirror simultaneously functions as an outcoupling mirror, the mirror is designed as an optical element which functions as a reversing mirror. In particular, a fiber-based optical element is provided, for example a fiber Bragg grating.

If there is no circulator in the main ring of the ultrashort pulse fiber laser, the propagation direction of the laser pulses of the main ring is established by an optical isolator integrated in the main ring.

Furthermore, the non-linear polarization-maintaining fiber in the secondary ring is selected to have a low dispersion. The dispersion of the fiber would still be normal for a laser wavelength of 1 μm; however, the amount would be very low. Since this fiber amounts for about 30-70% of the entire fiber length, the entire dispersion of the laser is less. The advantage is that, as a consequence of the lower arising dispersion, the dispersion compensation as well is once again significantly more compact.

In particular, the ultrashort pulse fiber laser is developed such that the dispersion compensation unit as a dispersion compensation element comprises at least one of the following optical elements:

At least one chirped mirror, in particular two chirped mirrors arranged plane-parallel relative to each other,
At least one Gires-Tournois interferometer (GTI) mirror, in particular at least two Gires-Tournois interferometers (GTI) mirrors arranged plane-parallel relative to each other,
At least one optical grating, in particular two optical gratings arranged plane parallel relative to each other and one reversing mirror,
At least one volume Bragg grating,
At least one prism,
At least one grating prism,
At least one chirped fiber Bragg grating.

If the dispersion compensation is generated by fiber-based optical elements, preferably a combination of an optical circulator and a chirped fiber Bragg grating is provided.

The introduction of a circulator furthermore allows a long polarization-maintaining or polarizing fiber, which is passed through in the double pass, to be spliced on. The advantage is that only-one half of such an expensive component has to be used. This not only lowers the production costs of the laser, particularly low pulse repetition rates within a range of 100 kHz and less than 5 MHz are achieved with this realization.

In the context of the present description, a chirped mirror is a dielectric mirror with a variable Bragg structure. In other words, it is a multilayer packet consisting of a succession of sequential double layers whose individual layers have highly differing refraction indices. An example of a material system that is provided is silicon/hafnium (Si/Hf). With a chirped mirror, the layer thickness of a double layer changes in the stack direction, i.e., perpendicular to the plane of the individual layers. The different wave lengths of an incoming laser pulse are reflected at a different depth of the dielectric mirror (by constructive interference). This yields a different propagation time for the different frequency and wavelength components of the light pulse. As a consequence, the dispersion of the laser pulse is compensated, and the pulse is compressed in time.

A Gires-Tournois interferometer mirror (also termed a GTI mirror) can be used as an alternative to a chirped mirror. Just like a suitable optical grating, prisms, a fiber Bragg grating or a volume Bragg grating, this generates a comparable optical effect. Which of the aforementioned optical elements is used is determined with reference to the respective application profile.

According to another embodiment, the at least one chirped mirror, in particular the two chirped mirrors, are highly dispersive chirped mirrors.

In the context of the present description, a highly dispersive chirped mirror is understood to be a mirror whose absolute value of the group delay dispersion is a value of at least 1000 $fs^2$.

Of course, a combination of the aforementioned optical elements into one common dispersion compensation element is also possible. The integration of abnormally dispersive optical fibers and the associated technical problems are advantageously avoided, for example with respect to their ability to be spliced to conventional fibers. Furthermore, the cited optical elements can be easily constructed, and they are therefore mechanically stable and affordably available.

According to the invention, a polarization adaptation element is provided at an output of the dispersion compensation unit, wherein the polarization adaptation element is set up to adapt a polarization state of a laser pulse leaving the dispersion compensation unit to a polarization device of the optical fiber.

Preferably, a first polarization adaptation element is provided at the input of the dispersion compensation unit, and a second polarization adaptation element is provided at the output of the dispersion compensation unit.

The polarization adaptation elements serve to adapt the polarization state of a laser pulse propagating in the resonator to the dispersion compensation unit. Accordingly, a laser pulse which exits the first end of the optical fiber is adapted to the polarization state of the optical fiber, into the second end of which the laser pulse is again coupled, taking into account the polarization property of the dispersion compensation element.

To propagate the laser pulses, the slow polarization axis of the optical fiber is used since this prevents overcoupling into the other axis due to the higher effective propagation index.

A polarization adaptation element in the context of the present description is an optical module or element which changes or adapts the polarization of the laser pulse.

In particular a λ/2- or λ/4-plate is provided as the polarization-adapting module. Whereas a λ/2 plate permits the adaptation of the polarization plane by rotating linearly polarized light, a λ/4 plate generates circularly polarized light from linearly polarized light and vice versa. The use of a λ/4 plate is advantageous in particular in association with a reflecting, dispersion-compensating element. The direction of propagation can be changed by the reflection. A combination of both or a plurality of such elements is also provided. Optionally, these are supplemented by one or more polarizers or analyzers, or other polarizing elements. The use of a thin, doubly-refracting crystal is also possible. It is furthermore possible to provide a permanently adjustable, rotatable fiber holder so that the outstanding polarization axis can be adapted to the incoming polarization state.

According to another exemplary embodiment, a Lyot filter is at the output of the dispersion compensation unit and comprises a polarizer and analyzer, as well as a doubly-refracting crystal arranged between the polarizer and analyzer, wherein the analyzer of the Lyot filter is provided as the polarization adaptation element. In other words, the analyzer of the Lyot filter fulfils a double function. In addition to adapting the polarization, this design furthermore achieves advantageous spectral filtering.

Furthermore according to one advantageous development, to adapt a polarization state of the laser pulse exiting the optical fiber at the first end and entering the dispersion compensation element at the input of the dispersion compensation unit, the first polarization adaptation element is provided between the first end of the optical fiber and the dispersion compensation element, and to adapt a polarization state of the laser pulse exiting the dispersion compensation element and entering the optical fiber at a second end at the output of the dispersion compensation element, a second polarization adaptation element is provided between the dispersion compensation element and the second end of the optical fiber.

If the dispersion compensation element has polarization-independent properties, the polarization adaptation element can be arranged before or after the dispersion compensation element.

Furthermore, the ultrashort pulse fiber laser in particular comprises an external pulse compressor outside of the resonator. This pulse compressor is in particular equipped with optical elements like those known from the dispersion compensation unit. For example, the external pulse compressor comprises at least one chirped mirror or GTI mirror, in particular two chirped mirrors or GTI mirrors arranged plane-parallel relative to each other. It is furthermore possible to construct the external pulse compressor from at least one optical grating, in particular two optical gratings and one deflecting mirror. It is also possible to use a volume Bragg grating or a fiber Bragg grating for the external pulse compressor.

Of course it is also envisioned and possible for the external pulse compressor to use at least one polarization adaptation module, in particular two or more polarization adaptation elements, in the manner described above in conjunction with the dispersion compensation element.

According to another embodiment, the ultrashort pulse fiber laser is developed in that the dispersion compensation unit is designed as a dispersion compensation and outcoupling unit, and comprises an outcoupler in particular designed as a non-fiber-based, discrete optical element. In particular, the outcoupler is also envisioned to function as a polarization adaptation element.

A separate outcoupler can therefore be advantageously omitted. The number of required fiber splicing points is also less. If the outcoupler such as a beam divider is also used as a polarization adaptation element, another optical component can be spared.

Further characteristics of the invention will become apparent from the description of the embodiments according to the invention together with the claims and the included drawings. Embodiments according to the invention can fulfil individual characteristics or a combination of several characteristics.

The invention is described below, without restricting the general idea of the invention, using exemplary embodiments with reference to the drawings, whereby we expressly refer to the drawings with regard to all details according to the invention that are not explained in greater detail in the text. In the figures.

In the drawings, the same or similar elements and/or parts are provided with the same reference numbers in order to prevent the item from needing to be reintroduced.

DETAILED DESCRIPTION

Figure 1:
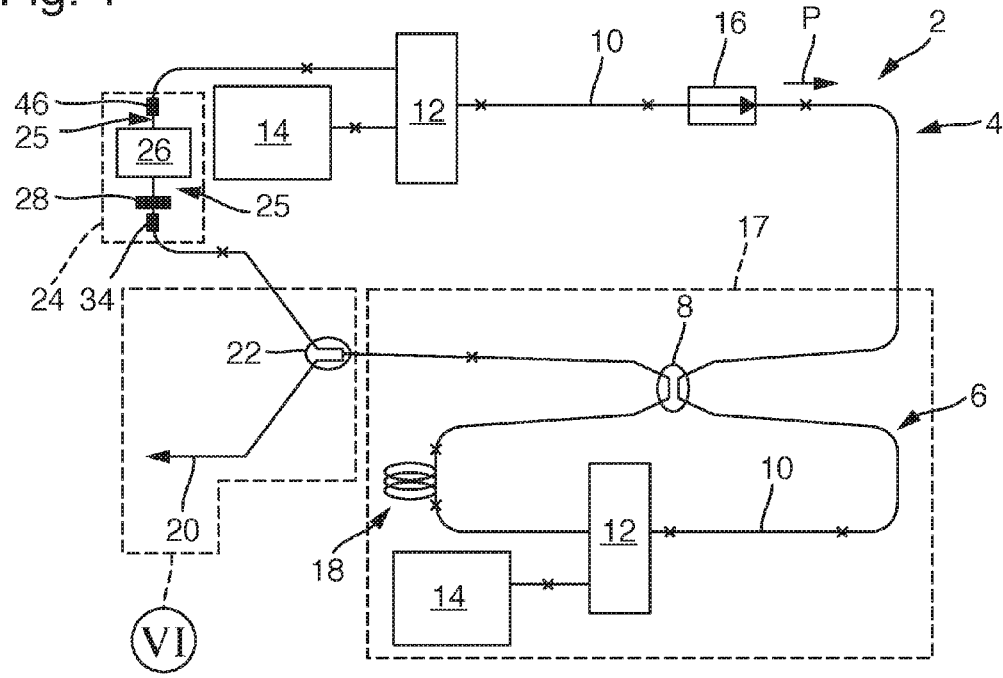
FIGS. 1 to 4 show a passively mode-locked ultrashort pulse fiber laser in a schematic and simplified representation.

FIG. 1 shows a schematic and simplified representation of a passively mode-locked ultrashort pulse fiber laser 2 with a resonator in a figure-of-eight configuration. This type or configuration of a fiber laser is frequently termed a figure of eight arrangement. The resonator of the ultrashort pulse fiber laser 2 comprises a main ring 4 and a secondary ring 6 designed as a non-linear Sagnac interferometer or Sagnac loop. The main ring 4 and the secondary ring 6 are coupled to each other by an optical coupler 8.

A laser pulse entering the secondary ring 6 via the coupler 8 is split into two partial pulses, wherein a first partial pulse is for example propagated into the secondary ring clockwise, and the second partial pulse is propagated into the secondary ring counterclockwise. The two partial pulses meet at the coupler 8 and interfere with each other. By adjusting the phase difference being the two partial pulses, the efficiency of the outcoupling can be adjusted by the interference between the two partial pulses.

An active fiber section 10 in which the material of the optical fiber is formed as a laser-active medium is located in the main ring 4 and in the secondary ring 6. After the signal passes through the laser amplifier, the signal has increased strength at the output. The fiber material of the active fiber section 10 is doped. Rare earths are possible doping elements, in particular ytterbium (Yb), erbium (Er), neodymium (Nd), thulium (Tm), holmium (Ho) or praseodymium (Pr). The choice of the suitable doping element depends on the desired basic wavelength of the ultrashort pulse fiber laser 2.

Furthermore, a wavelength multiplexer 12 is integrated in the main ring 4 and in the secondary ring 6. The wavelength multiplexer 12 serves to couple pump light into the active fiber section 10. For this purpose, a pump light source 14 is coupled to each wavelength multiplexer 12. The pump light source 14 is for example a laser diode source or a different suitable pump light source.

An optical isolator 16 is also integrated in the main ring 4 which ensures that the propagation direction of the light pulse indicated with an arrow is maintained in the main ring 4. Alternatively to the optical isolator 16, an optical circulator is provided, and the associated exemplary embodiments will be addressed below.

Furthermore, a passive optical fiber 18 is integrated in the secondary ring 6. The laser pulses generated in the ultrashort pulse fiber laser 2 are coupled out at an output 20 which is coupled via an output coupler 22 to the main ring 4.

In the exemplary embodiments shown in FIG. 1, there is an active fiber section 10 both in the main ring 4 as well as in the secondary ring 6. Correspondingly, the secondary ring 6 which is designed as a non-linear Sagnac interferometer, is a so-called NALM (non-linear amplifying loop mirror). According to other exemplary embodiments (not shown), an active fiber section 10 and, correspondingly, the associated wavelength multiplexer 12 as well, along with the pump light source 14 connected thereto is only provided in one of the two fiber rings, i.e., either in the main ring 4 or in the secondary ring 6. The optical fibers from which the ultrashort pulse fiber laser 2 is constructed are all polarization-maintaining or polarizing fibers, in particular polarization-maintaining single mode optical fibers.

The fiber connection between the pump light source 14 and the wavelength multiplexer 12 can be non-polarization maintaining or polarization maintaining.

The employed optical fibers are considered polarization-maintaining when they have a polarization-maintaining effect with respect to the laser signal of the ultrashort pulse fiber laser 2.

The ultrashort pulse fiber laser 2 functions for example at a repetition frequency of 20 MHz and an average laser wavelength within the range of between 1000 nm and 1100 nm.

The ultrashort pulse fiber laser 2 has a dispersion compensation unit 24. This is arranged in the resonator of the ultrashort pulse fiber laser 2, or is integrated in the resonator. The dispersion compensation unit 24 comprises a dispersion compensation element 26. Furthermore, a first polarization adaptation element 28 is provided that is provided to adapt a polarization state of laser pulses propagating in the fibers into the optical dispersion compensation element 26.

The polarization adaptation element 28 is arranged in the propagation direction P before the dispersion compensation element 24 since the dispersion compensation element 24 has polarization-independent properties. According to additional exemplary embodiments, the polarization adaptation element is arranged after the dispersion compensation element. In a more general instance, two polarization adaptation modules are provided before and after the dispersion compensation element 24. This applies to all exemplary embodiments.

Figure 2:
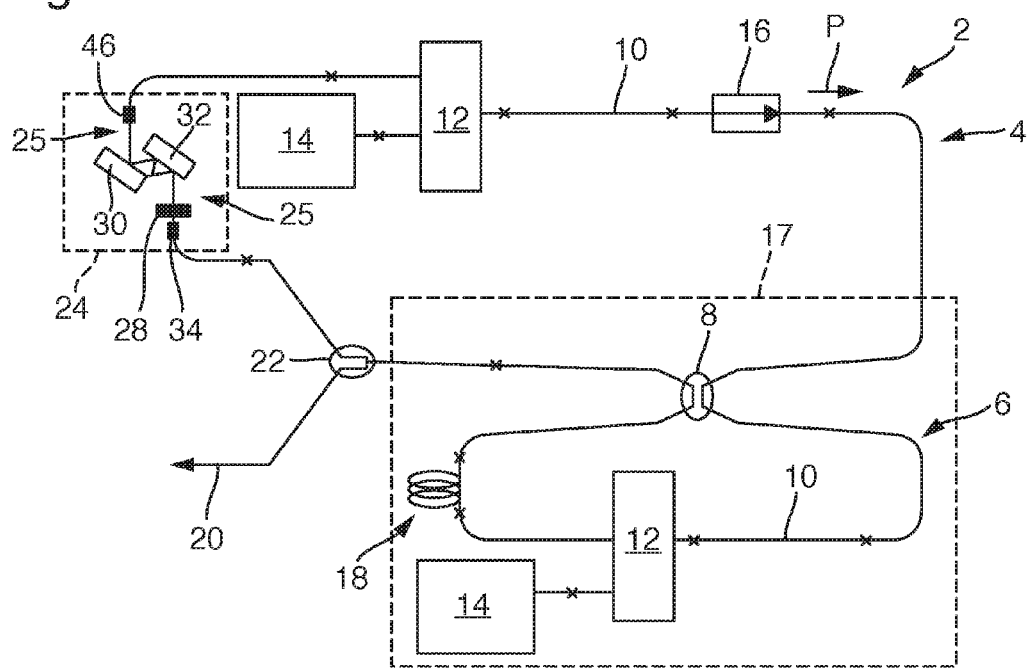

FIG. 2 shows an additional ultrashort pulse fiber laser 2. Elements of this ultrashort pulse fiber laser 2 provided with identical reference numbers are designed identical to those elements of the ultrashort pulse fiber laser 2 which were already explained in conjunction with FIG. 1. For this reason, repeated explanations will not be provided.

As a dispersion compensation element 26, the dispersion compensation unit 24 comprises a first chirped mirror 30 and a second chirped mirror 32. The first and second chirped mirrors 30, 32 are preferably arranged plane-parallel relative to each other. It is therefore possible for the laser pulses generated in the ultrashort pulse fiber laser 2 to execute several passages within the dispersion compensation element 26, i.e., be reflected several times by the first and second chirped mirror 30, 32. Furthermore, a first polarization adaptation element 28 is provided for adapting the polarization states in the fibers in the dispersion compensation element 26. The first polarization adaptation element 28 is arranged between a first end 34 of the optical fibers and the dispersion compensation element 26 according to the depicted exemplary embodiment of the arrangement of the two chirped mirrors 30, 32 oriented in a plane-parallel manner.

Just like the exemplary embodiment depicted in FIG. 1, the polarization adaptation element 28 is arranged in propagation direction P before the dispersion compensation element 24 since the dispersion compensation element 24 has polarization-independent properties. In this case as well, an arrangement before or on both sides of the dispersion compensation element 24 is provided.

The chirped mirrors 30, 32 are dielectric mirrors with a variable Bragg structure. They are advantageously stable and economical and are hence available as elements for compensating the dispersion of the propagated the laser pulses. Dielectric mirrors with a variable Bragg structure are multilayer systems in which alternating layers are alternatingly stacked on each other with strongly differing optical refraction indices. By varying the thickness of the double layer, i.e., the total layer thickness of the two different materials, components of the laser pulse with different wavelengths are consequently reflected at a different depth in the layer packet. The dispersion is thereby compensated. A suitable material system is, for example, silicon oxide/hafnium oxide.

The first and second chirped mirrors 30, 32 are in particular highly dispersive chirped mirrors 30, 32. In the context of the present description, a highly dispersive chirped mirror is understood to be such a mirror that is set up to compensate for an absolute group delay dispersion of at least 1000 $fs^2$. It is therefore possible to replace one or both chirped mirrors 30, 32 with a regular, i.e., non-dispersive mirror.

Figure 3:
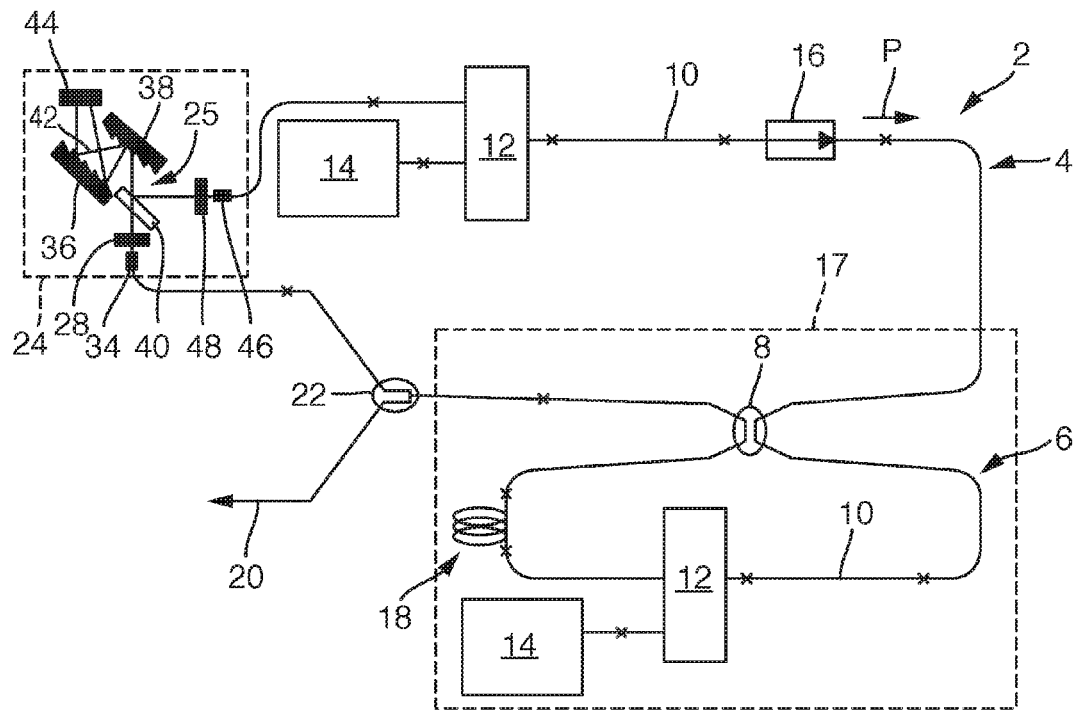

FIG. 3 shows an additional ultrashort pulse fiber laser 2. Apart from the dispersion compensation unit 24, this ultrashort pulse fiber laser is identical to the ultrashort pulse fiber lasers 2 shown in FIGS. 1 and 2. For this reason, the known components with identical reference numbers will not be presented again.

As a dispersion compensation element 26, the dispersion compensation unit 24 comprises a first optical grating 36 and a second optical grating 38 according to the depicted exemplary embodiment. The first and second optical gratings 36, 38 are preferably arranged plane-parallel relative to each other. In addition, a first polarization adaptation element 28 is located at the input to the dispersion compensation unit 24. This first polarization adaptation element is arranged between the first end 34 of the optical fiber and the dispersion compensation element 26. The laser pulse exiting the first end 34 is adapted relative to its polarization by the first polarization adaptation element 28 to the dispersion compensation element 26; in the depicted case to the first and second optical gratings 36, 38. After the laser pulse has passed through the first polarization adaptation element 28, it contacts the second optical grating 38. The second optical grating 38 causes a spectral spreading of the laser pulse depicted by the expanded ray bundle 42. Following subsequent reflection by the first optical grating 36, the expanded ray bundle 42 contacts a reversing mirror 44 which reflects it. Alternatively to a reversing mirror 44, a reversing prism or a tipped mirror is provided.

Dispersion compensation occurs due to the geometry-based differences in transit time of the individual spectral components in the expanded ray bundle 42. After it is again reflected by the second optical grating 38, the laser pulse thereby compensated for dispersion is then reflected by the mirror 40 toward a second end 46 of the optical fiber. To adapt the polarization to the optical fiber, the laser pulse passes through a second polarization adaptation element 48. This is arranged at the output of the dispersion compensation unit 24 between the first end 46 of the optical fiber and the dispersion compensation element 28. In other words, the dispersion compensation element 26 in the exemplary embodiment depicted in FIG. 3 comprises the mirror 40, the first and second optical grating 36, 38 as well as the reversing mirror 44. If the gratings are polarization-independent, one or both polarization adaptation elements 28, 48 can be discarded.

The optical fibers used to construct the ultrashort pulse fiber laser 2 are polarization-maintaining or polarizing optical fibers; consequently the laser pulses in the resonator of the ultrashort pulse fiber laser 2 are propagated as linearly polarized pulses. The first and second polarization adaptation element 28, 48 serve to adapt the polarization of e.g. linearly polarized laser pulses propagated in the resonator to the type or direction of polarization of the dispersion component element 26. The second polarization adaptation element 48 serves to readapt the polarization, such as the polarization plane, of the laser pulse leaving the dispersion compensation element 26 to the type or plane of polarization in which the light pulses within the resonator, i.e. in the optical fiber, propagate. If the dispersion compensation element 26 is polarization-independent, one or both polarization adaptation elements 28 or 48 can be discarded.

Figure 4:
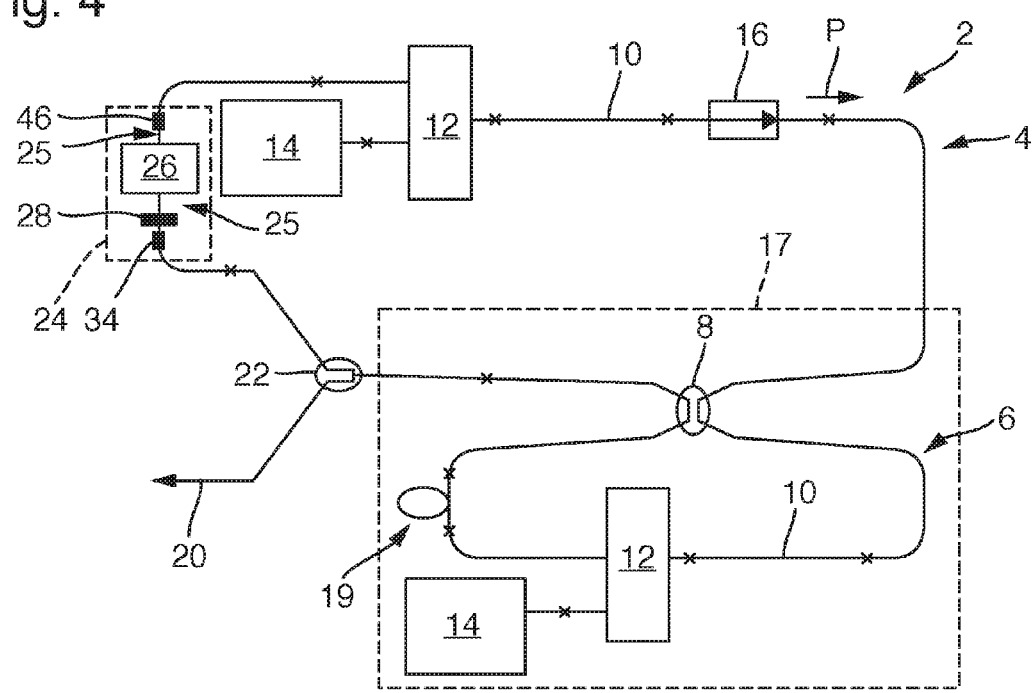

FIG. 4 shows another ultrashort pulse fiber laser 2 which is constructed identical to the ultrashort pulse fiber laser 2 depicted schematically and simplified in FIG. 1. Apart from the fact that the passive optical fiber 18 is a highly non-linear passive polarization-maintaining or polarizing optical fiber 19.

In the context of the present description, a highly non-linear optical fiber is considered a fiber with a fiber non-linearity factor $\gamma=\omega 0/c0 \, n2/Aeff$ greater than three, in particular greater than five, furthermore in particular greater than seven, moreover in particular greater than eight, furthermore in particular greater than ten and moreover in particular greater than 13. All values are in $1/(km \times W)$.

This highly non-linear optical fiber is also polarization-maintaining. In the aforementioned formula, $\omega 0$ is the angular frequency of the laser light, c0 is the speed of light in unrestricted space, n2 is the non-linear refraction index coefficient with regard to the intensity ($n=n0+n2 \times I$ with I=the intensity of the light) and Aeff is the effective mode surface of the optical fiber (with $Aeff=\pi \times (MFD/2)^2$ with MFD=the diameter of the mode field in the fiber waveguide (mode field diameter).

The product of $\gamma^*L$ is decisive for the functionality of the ultrashort pulse fiber laser 2, wherein L is the length of the passive optical fiber 18. In comparison to conventional non-linear optical fibers whose value $\gamma$ lies between one and five, the use of a highly non-linear passive optical fiber 18 leads to a shortening of the required fiber length. It is for example advantageously possible to provide a passive optical fiber 18 that is only 1.5 m long instead of a passive optical fiber 18 that is 15 m long. This shortens the transit times of the laser pulses in the resonator of the ultrashort pulse fiber laser 2. Higher repetition frequencies are possible. For example, the ultrashort pulse fiber laser according to the depicted exemplary embodiment delivers a pulse repetition rate of 20 MHz and more instead of the otherwise possible repetition frequency of around 10 MHz. In addition, the noise characteristics of the laser are reduced due to the lower pulse repetition rate.

Figure 5:
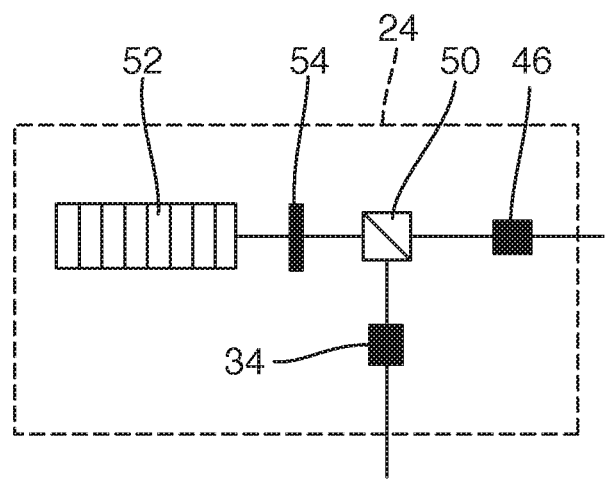
FIG. 5 shows a dispersion compensation unit in a schematic and simplified representation.

FIG. 5 shows a dispersion compensation unit 24 which is integrated in an ultrashort pulse fiber laser 2 according to another exemplary embodiment. For example, the dispersion compensation unit 24 shown in FIG. 1 is replaced by the dispersion compensation unit 24 shown in FIG. 5. The dispersion compensation unit 24 shown in FIG. 5 in a schematic and simplified manner comprises a volume Bragg grating as the dispersion compensation element 26. A laser pulse exiting the first end 34 of the optical fiber passes first through the beam splitter 50 and is deflected toward the volume Bragg grating. The laser pulse first passes through a λ/4 plate 54 before it passes through again after being reflected by the volume Bragg grating 52. The λ/4 plate therefore simultaneously serves the function of the first and second polarization adaptation element 28, 48. The linearly polarized laser pulse is converted into a circularly polarized laser pulse by the λ/4 plate 54 and is reflected by the volume Bragg grating 52, wherein the dispersion of the laser pulse is compensated. Then the circularly polarized laser pulse is converted back into linearly polarized light by the λ/4 plate 54, and passes through the beam splitter 50 in the direction of the second end 46 of the optical fiber.

Figure 6:
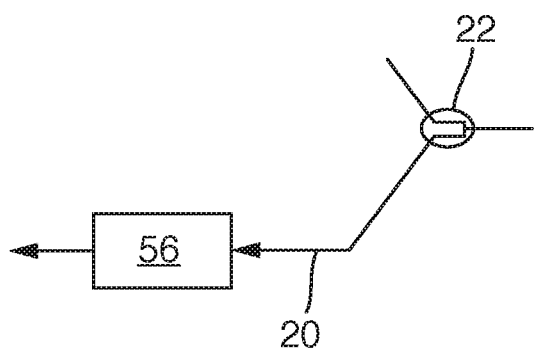
FIG. 6 shows an external pulse compressor provided at the output of a passively mode-locked ultrashort pulse fiber laser.

According to another exemplary embodiment, the ultrashort pulse fiber laser 2 comprises an external pulse compressor 56. To this end, the section of the ultrashort pulse fiber laser 2 designated with VI in FIG. 1 is replaced with the configuration shown in FIG. 6. The laser pulse leaving the output 20 enters the external pulse compressor 56 and exits at its output. The external pulse compressor 56 is preferably constructed similar to the dispersion compensation unit 24. This holds true for all exemplary embodiments.

Figure 7:
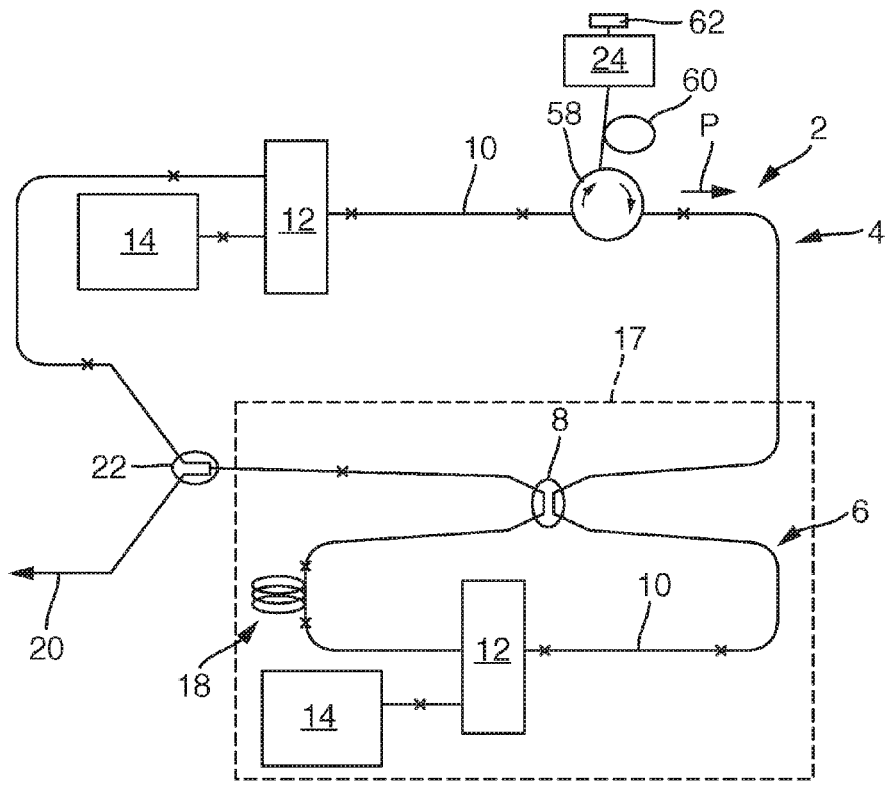
FIGS. 7 to 11 show additional passively mode-locked ultrashort pulse fiber lasers in a schematic and simplified representation, FIG. 12, 13 show simplified schematic representations of a dispersion compensation and outcoupling unit.

FIG. 7 shows a simplified, schematic representation of another ultrashort pulse fiber laser 2. The ultrashort pulse fiber laser 2 is constructed similar to the ultrashort pulse fiber laser 2 depicted in FIG. 1. Instead of the optical isolator depicted in FIG. 1, the design depicted in FIG. 7 comprises an optical circulator 58, a delaying fiber section 60 and a reversing mirror 62, however.

The optical circulator 58 has a first to third connection. The circulator 58 is integrated in the main ring 4 such that the laser pulses propagating in the main ring 4 in the direction of propagation P are coupled into the circulator 58 at a first connection, and are sent to the second connection by the circulator 58. The delaying fiber section 60 is coupled to this second connection of the circulator 58. The delaying fiber section 60 also forms a part of the main ring 4. A deflection mirror 62 is at the end of the delaying fiber section 60 facing away from the circulator 58. The dispersion compensation unit 24 is also located at this end. It is designed as noted in the aforementioned exemplary embodiments.

The reversing mirror 62 reflects laser pulses which have passed through the delaying fiber section 60 back into the delaying fiber section 60 to provide a double pass configuration. As a result, the delaying fiber section 60 is passed through twice, and its length is used twice as an optical path.

Both a separate optical element, such as a mirror, as well as a fiber-based element, such as a fiber Bragg grating, are provided as the reversing mirror 62. Due to the long optical path in the main ring 4, the depicted ultrashort pulse fiber laser 2 is designed for particularly low pulse repetition rates.

Figure 8:
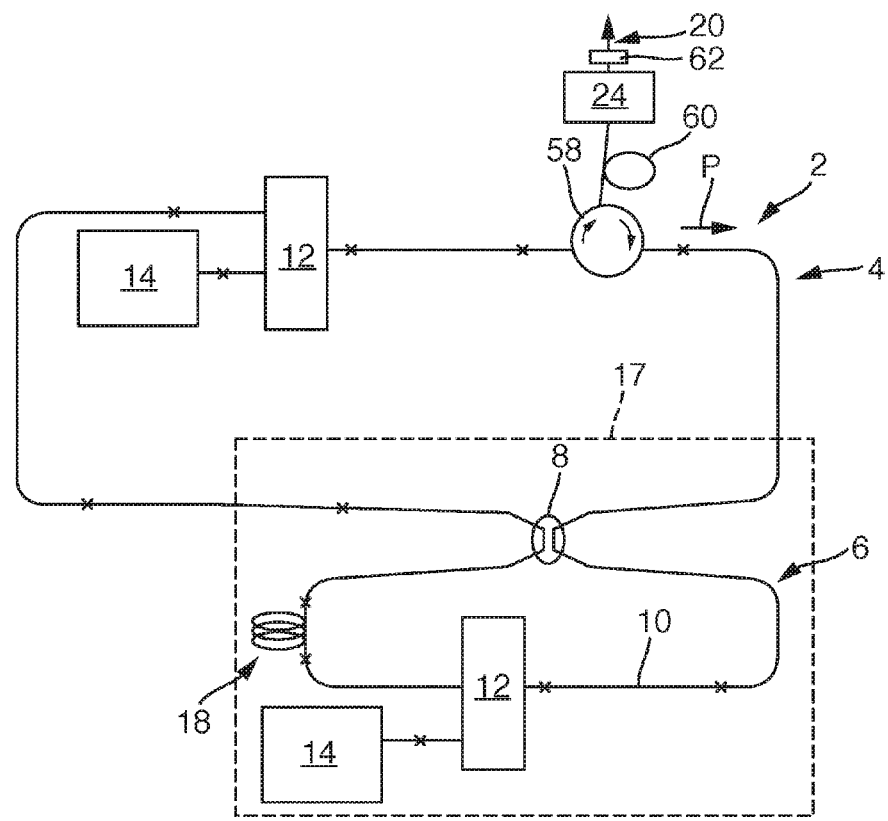

FIG. 8 shows a schematic, simplified representation of another ultrashort pulse fiber laser 2 which only differs from the ultrashort pulse fiber laser 2 depicted in FIG. 7 in that the reversing mirrors 62 simultaneously serves as an outcoupling mirror to out-couple the generated laser pulses. It is hence advantageously possible to dispense with the outcoupler 22 (see FIG. 7).

Figure 9:
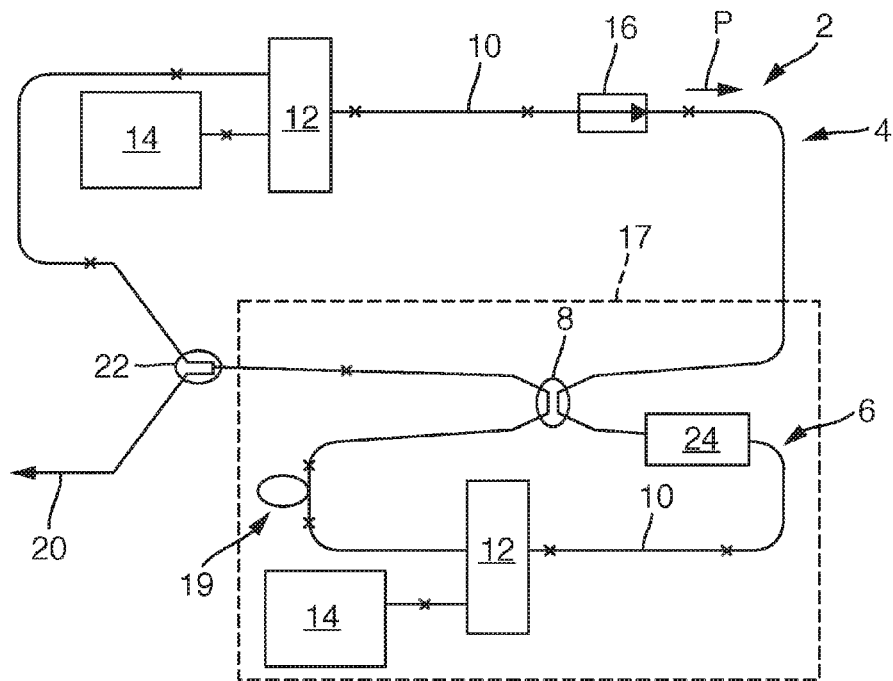

FIG. 9 shows another ultrashort pulse fiber laser 2 which is designed similar to the ultrashort pulse fiber laser 2 depicted in FIG. 4. In contrast to the configuration depicted in FIG. 4, the dispersion compensation unit 24 is, however, not located in the main ring 4, but rather in the secondary ring 6.

In particular, the dispersion compensation unit is 24 arranged directly after the coupler 8. An asymmetrical arrangement is provided in the non-linear Sagnac loop (secondary ring 6). With such an asymmetrical arrangement of the dispersion compensation unit 24 directly after the coupler 8, the laser pulses coupled into the secondary ring 6 are preferably chirped or stretched. The great majority of the imprinted chirp is compensated by the dispersion compensation unit 24 so that, after passing through the dispersion compensation unit 24, the laser pulse has a higher pulse peak performance. The compressed laser pulse generates non-linear effects in the highly non-linear fiber section 19 comparable to those that an amplified, uncompressed laser pulse would produce.

This effect is exploited to even greater effect by the exemplary embodiment depicted in FIG. 10 which again shows a schematic, simplified representation of an ultrashort pulse fiber laser 2. A dispersion compensation unit 24a, 24b is provided in the main ring 4 as well as in the secondary ring 6. The laser pulses circulating in the main ring 4 are provided with a chirp by the first dispersion compensation unit 24a, which chirp is compensated in the second dispersion compensation unit 24b. Due to the increased pulse peak performance, an elevated non-linear effect occurs in the highly non-linear fiber section 19, for example with respect to self-phase modulation. The advantage of the asymmetrical arrangement of the dispersion compensation unit 24b is that the accumulated non-linear phase becomes more different in both circulation directions. This effect is essential to the functioning of a non-linear Sagnac interferometer, and it is therefore possible to entirely dispense with the use of a fiber amplifier in the secondary ring 6. This significantly decreases the production cost of the ultrashort pulse fiber laser 2.

Figure 10:
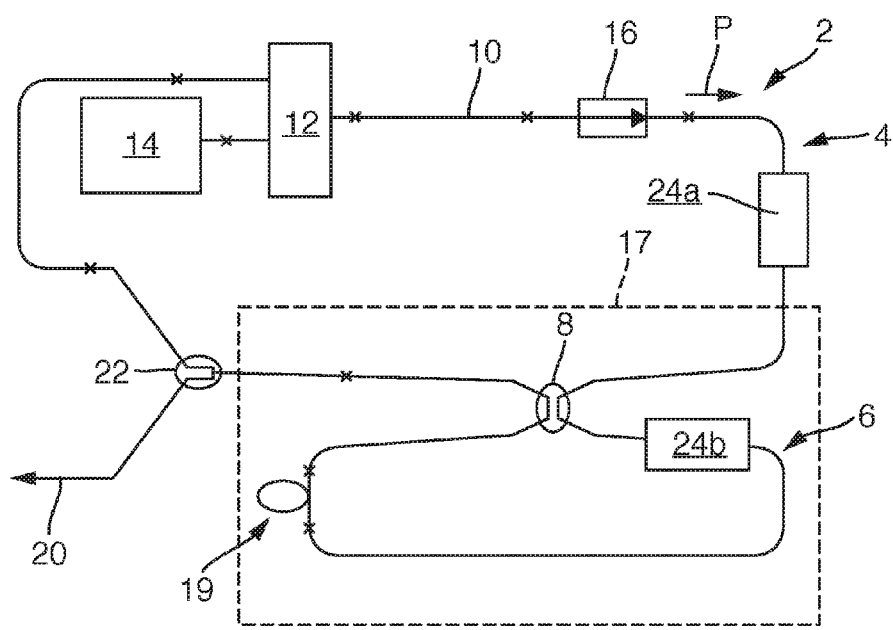

Alternatively to the highly non-linear fiber 19 in FIGS. 9 and 10, it is possible to use a non-linear fiber 18 with less non-linearity as in the exemplary embodiments in FIGS. 1 to 3 as well as FIGS. 7 and 8.

Figure 11:
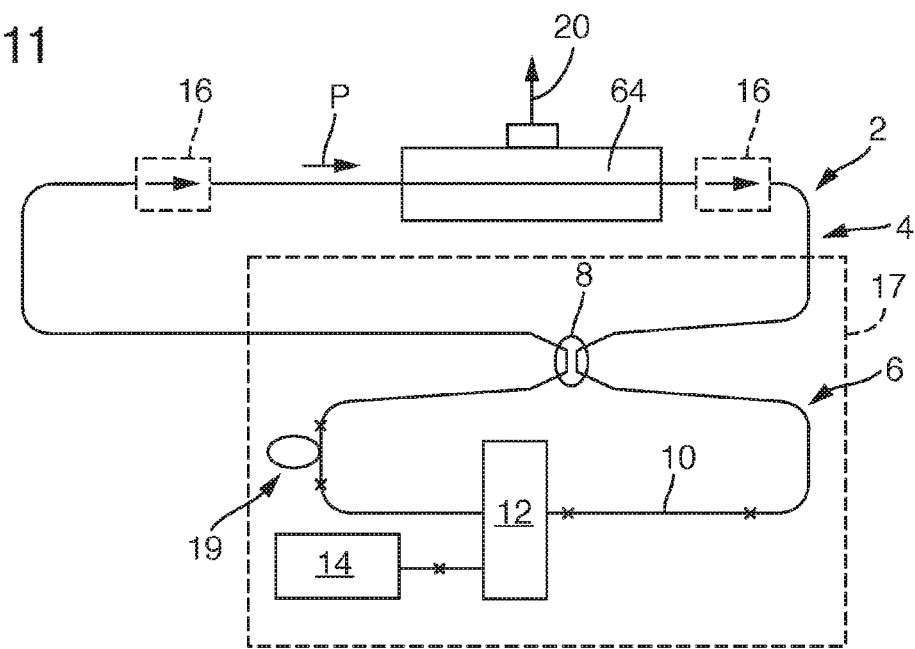

FIG. 11 shows a schematically simplified representation of an ultrashort pulse fiber laser 2 whose resonator comprises a main ring 4 and a secondary ring 6 designed as a non-linear Sagnac interferometer. The main ring 4 and the secondary ring 6 are coupled to each other by an optical coupler 8. In the secondary ring 6, there is an active fiber section 10 as well as a wavelength multiplexer 12 which serves to couple in a pump signal provided by a pump light source 14. In addition, a non-linear optical fiber 19 is integrated in the secondary ring 6. The secondary ring 6 together with the optical coupler 8 forms a so-called NALM (non-linear amplifying loop mirror).

An example of a propagation direction P of the light pulses is sketched in the main ring 4. To ensure that the propagation direction P is maintained in the main ring 4, an optical isolator 16 is provided that can be integrated alternately at the two depicted positions in the main ring 4, or as a discrete optical element in a dispersion compensation and outcoupling unit 64.

In contrast to the aforementioned exemplary embodiments, the exemplary embodiment shown in FIG. 11 comprises such a dispersion compensation and outcoupling unit 64. This combines the function of the dispersion compensation unit 24 with that of the outcoupler 22 (see for example FIGS. 1 to 4). Correspondingly, the dispersion compensation and outcoupling unit 64 provide an output 20 for the laser light generated by the ultrashort pulse fiber laser 2.

Figure 12:
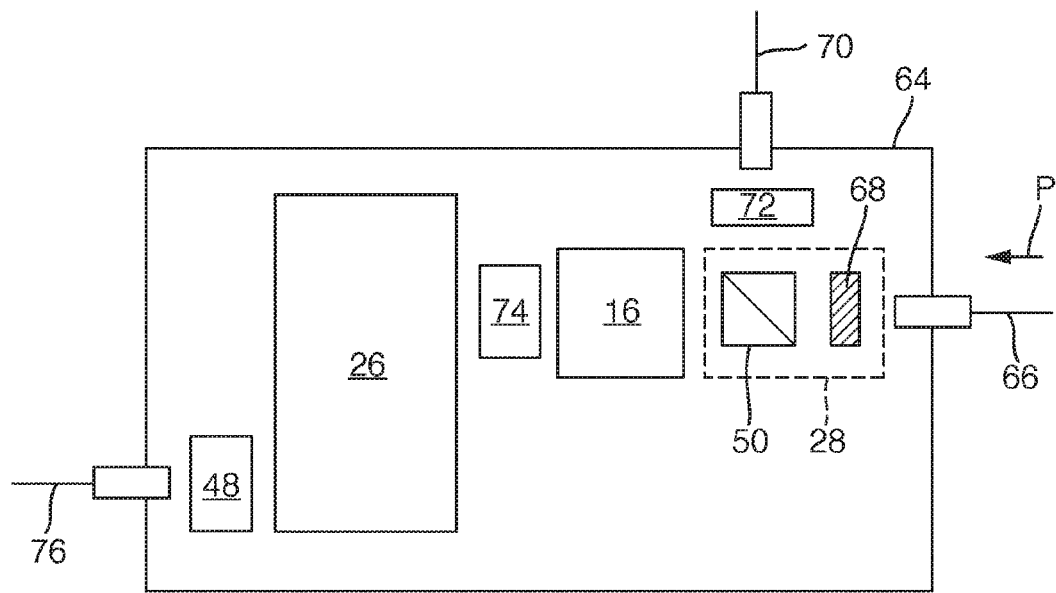
Figure 13:
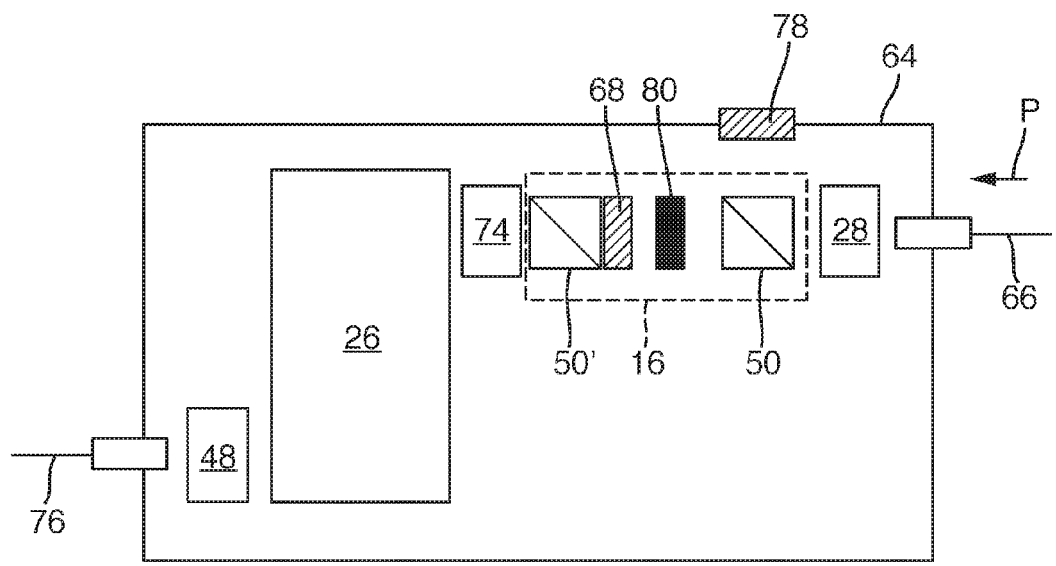

A dispersion compensation and outcoupling unit 64 according to different exemplary embodiments is shown in FIGS. 12 and 13.

The laser pulse entering the unit depicted in FIG. 12 in the propagation direction P of the polarization-maintaining optical fiber at the input, also termed the input fiber 66, initially contacts a first polarization adaptation element 28. This comprises a λ/2 plate 68 that has the function of adjusting the polarization plane of the laser pulse exiting the fiber to a desired direction. The function of the λ/2 plate 68 corresponds to a rotation of the input fiber 66 about its own axis. The first polarization adaptation element 28 furthermore comprises a beam splitter 50 which also functions as a polarizer, by means of which a part of the entering laser beam is deflected in the direction of the output fiber 70. To adapt the polarization of the out-coupled laser pulse at the output fiber 70, an additional polarization adaptation element is provided (such as a third polarization adaptation element 72). This is optional. The function of the polarization adaptation element 72 corresponds to a rotation of the output fiber 70 about its own axis.

Instead of the output fiber 70, an output window can be provided according to another exemplary embodiment (not shown) through which the laser beam is coupled out.

Following the first polarization adaptation element 28 in the propagation direction P, the dispersion compensation and outcoupling unit 64 comprises an optical isolator 16. The optical isolator 16 is optionally arranged within the dispersion compensation and outcoupling unit 64. As shown in FIG. 11, an optical isolator 16 can also be arranged before or after this unit 64 in the propagation direction P. In such a case, the isolator is however a fiber-based isolator and not a discrete optical component. In other words, the optical isolator 16 is optionally provided within the dispersion compensation and outcoupling unit 64. This furthermore comprises another polarization adaptation element such as a fourth polarization adaptation element 74. The polarization adaptation element 74 is optional. Its necessity depends on the chosen dispersive element within the dispersion compensation element 26. The laser pulse propagating in the propagation direction P subsequently strikes the dispersion compensation element 26 which is designed according to one of the previously-cited exemplary embodiments. Before the laser pulse at the output of the dispersion compensation and outcoupling unit 64 enters the output fiber 76, it passes through the second polarization adaptation element 48 which is known from the preceding exemplary embodiments like the first polarization adaptation element 28. The function of the second polarization adaptation element 48 corresponds to a rotation of the output fiber 76 about its own axis.

The advantage of the portrayed design is that the fiber outcoupler 22 can be dispensed with as well as the fiber-integrated isolator 16. First of all, fewer fiber splicing points are accordingly needed in the resonator which simplifies production, and second, less fiber is used in the resonator which renders the laser 2 more compact overall and enables faster pulse repetition rates. Furthermore, less compensation of the dispersion is required in the dispersion compensation unit 26 which also renders this unit more compact.

The sequence of the portrayed elements can be varied. For example, the sequence of the isolator 16 and dispersion compensation element 26 can be exchanged. The beam splitter 50 functioning as an outcoupler could also be arranged at the end of the dispersion compensation and outcoupling unit 64. As already mentioned, an outcoupling window, in particular an optically anti-reflection coated glass, can be used instead of the output fiber 70 (free beam outcoupling).

The dispersion compensation and outcoupling unit 64 in FIG. 13 is designed for free-beam outcoupling and correspondingly comprises an outcoupling window 78. [The outcoupler in this exemplary embodiment is coupled to the optical isolator and is more or less "fused".] An isolator typically consists of two polarizers or beam splitters 50, 50', of which the first beam splitter 50 can be directly used to outcouple the laser beam. Furthermore, the isolator furthermore comprises a Faraday rotator 80 as well as a combination of the λ/2 plate 68 and second beam splitter 50 known from FIG. 12. The function of the λ/2 plate corresponds to a rotation of the polarizing beam splitter 50 about the optical axis, i.e., the beam direction when striking the element at a right angle. The other elements provided with the identical reference signs are known from FIG. 12.

As already mentioned, the function of the polarization adaptation elements at the input and output of the dispersion compensation and outcoupling unit 64 correspond to a rotation of the input fiber 66 and the output fiber 76. The optical isolator 16 can optionally be arranged inside or outside of the dispersion compensation and outcoupling unit 64. Likewise, free-beam outcoupling or outcoupling into an output fiber 70 can alternatively occur. If corresponding polarization adaptation elements are to be dispensed with, the input and output fibers 66, 76 would have to be correspondingly fixed in the adjusted position in or on the dispersion compensation and outcoupling unit 64. This is also provided according to additional exemplary embodiments.

All named characteristics, including those taken from the drawings alone and individual characteristics, which are disclosed in combination with other characteristics, are considered alone and in combination as essential for the invention. Embodiments according to the invention can be fulfilled through individual characteristics or a combination of several characteristics. In the scope of the invention, characteristics, which are designated with "in particular" or "preferably" are optional features.

REFERENCE LIST

2 Ultrashort pulse fiber laser
4 Main ring
6 Secondary ring
8 Optical coupler
10 Active fiber section
12 Wavelength multiplexer
14 Pump light source
16 Optical isolator
17 NALM
18 Passive optical fiber
19 Highly non-linear optical fiber
20 Output
22 Outcoupler
24, 24a, 24b Dispersion compensation unit
26 Dispersion compensation element
25 Free beam path
28 First polarization adaptation element
30 First chirped mirror
32 Second chirped mirror
34 First end
36 First optical grating
38 Second optical grating
40 Mirror
42 Ray bundle
44 Reversing mirror
46 Second end
48 Second polarization adaptation element
50, 50' Beam splitter
52 Volume Bragg grating
54 λ/4 plate
56 External pulse compressor
58 Circulator
60 Delaying fiber section
62 Reversing mirror
64 Dispersion compensation and outcoupling unit
66 Input fiber
68 λ/2 plate
70 Output fiber
72 Third polarization adaptation element
74 Fourth polarization adaptation element
76 Output fiber
78 Outcoupling window
80 Faraday rotator
P Propagation direction

What is claimed is:

1. A passively mode-locked ultrashort pulse fiber laser for generating ultrashort laser pulses, comprising: a resonator in a figure-of-eight configuration, wherein the resonator has a main ring and a secondary ring optically coupled thereto designed as a non-linear Sagnac interferometer, and wherein the main ring and the secondary ring are constructed of polarization-maintaining optical fibers, and the main ring and/or secondary ring have a fiber section designed as a laser-active medium, wherein the laser-active medium is optically pumped through an externally-coupled pump light source which is also comprised, wherein there is at least one dispersion compensation unit in the resonator for compensating a group delay dispersion of the ultrashort laser pulses, wherein the dispersion compensation unit is a separate optical unit, and wherein the dispersion compensation unit comprises at least one dispersion compensation element, and a free beam path at one input and/or an output of the dispersion compensation unit is provided between a first end and/or a second end of the optical fiber of the main ring and/or the secondary ring and the dispersion compensation element, such that the dispersion compensation element forms an optical unit separate from the optical fiber, and wherein a polarization adaptation element is provided at an output of the dispersion compensation unit, wherein the polarization adaptation element is set up to adapt a polarization state of a laser pulse leaving the dispersion compensation unit to a polarization direction of the optical fiber,
  wherein a Lyot filter is provided at the output of the dispersion compensation unit that comprises a polarizer and analyzer, as well as a doubly-refracting crystal arranged between the polarizer and analyzer, wherein the analyzer of the Lyot filter is provided as the polarization adaptation element.

2. The ultrashort pulse fiber laser according to claim 1, wherein the secondary ring comprises a section consisting of a non-linear optical fiber, and the dispersion compensation unit is arranged in the secondary ring, further wherein, the fiber section is a laser active medium is provided in the secondary ring.

3. The ultrashort pulse fiber laser according to claim 1, wherein the main ring and the secondary ring are coupled by a coupler, wherein the dispersion compensation unit in the secondary ring is arranged directly adjacent to the coupler.

4. The ultrashort pulse fiber laser according to claim 2, wherein the dispersion compensation unit and the section consisting of the non-linear optical fiber are arranged directly adjacent to each other such that a laser pulse propagating in the secondary ring that has passed through the dispersion compensation unit to compensate for its group delay dispersion subsequently directly enters the section consisting of the non-linear optical fiber, wherein the secondary ring does not comprise a laser-active medium.

5. The ultrashort pulse fiber laser according to claim 1, wherein a first dispersion compensation unit is provided in the main ring, and a second dispersion compensation unit is provided in the secondary ring.

6. The ultrashort pulse fiber laser according to claim 2, wherein the non-linear optical fiber is a highly non-linear optical fiber or a highly non-linear optical fiber section, wherein the fiber non-linearity factor of the highly non-linear optical fiber, or the highly-non-linear optical fiber section, is greater than three, wherein the fiber non-linearity factor is considered to be in the unit $1/(W*km)$.

7. The ultrashort pulse fiber laser according to claim 1, wherein an optical circulator with a first to third connection is provided in the main ring, wherein the circulator is integrated in the main ring such that laser pulses propagating in the main ring in a direction of propagation are coupled into the circulator at the first connection and are transferred by the circulator to the second connection, wherein a delaying fiber section of the main ring is coupled to the second connection, and a reversing mirror is provided at its end facing away from the circulator, the reversing mirror being set up to reflect the laser pulses passing through the delaying fiber section back into the delaying fiber section, wherein laser pulses that have passed through the delaying fiber section coming from the reversing mirror are coupled at the second connection into the circulator and are transmitted by the circulator to the third connection so that the laser pulse is propagated in the direction of propagation into the main ring.

8. The ultrashort pulse fiber laser according to claim 7, wherein the reversing mirror is simultaneously designed as an outcoupling mirror for coupling out the laser pulses propagating in the resonator.

9. The ultrashort pulse fiber laser according to claim 1 wherein the dispersion compensation unit as a dispersion compensation element comprises at least one of the following optical elements:
  at least one chirped mirror,
  at least one Gires-Tournois interferometer mirror,
  at least one optical grating,
  at least one volume Bragg grating,
  at least one prism,
  at least one grating prism, and
  at least one chirped fiber Bragg grating.

10. The ultrashort pulse fiber laser according to claim 9, wherein the at least one chirped mirror are highly dispersive chirped mirrors.

11. The ultrashort pulse fiber laser according to claim 1, further comprising an external pulse compressor outside of the resonator.

12. The ultrashort pulse fiber laser according to claim 1, wherein the dispersion compensation unit is designed as a dispersion compensation and outcoupling unit, and comprises an outcoupler.

13. The ultrashort pulse fiber laser according to claim 12, wherein the outcoupler also functions as a polarization adaptation element.

* * * * *